(12) United States Patent
Asom et al.

(10) Patent No.: US 7,170,754 B2
(45) Date of Patent: Jan. 30, 2007

(54) SDIO MEMORY AND INTERFACE CARD

(75) Inventors: Moses Asom, Fairview, TX (US);
Yinon Degani, Highland Park, NJ (US);
Joe Ryan, Dallas, TX (US); Kunquan Sun, Plano, TX (US); Yanbing Yu, Plano, TX (US); Meng Zhao, Plano, TX (US)

(73) Assignee: Sychip Inc., Plano, TX (US)

( * ) Notice: Subject to any disclaimer, the term of this patent is extended or adjusted under 35 U.S.C. 154(b) by 269 days.

(21) Appl. No.: 10/839,901

(22) Filed: May 6, 2004

(65) Prior Publication Data

US 2005/0248926 A1    Nov. 10, 2005

(51) Int. Cl.
*H05K 1/14* (2006.01)

(52) U.S. Cl. ............... 361/737; 361/683; 361/686; 439/76.1

(58) Field of Classification Search ........... 361/737, 361/727, 683–686; 439/76.1; 316/737, 316/727; 235/492, 441
See application file for complete search history.

(56) References Cited

U.S. PATENT DOCUMENTS

2002/0177335 A1* 11/2002 Tsuchioka ............. 439/76.1
2005/0013106 A1*  1/2005 Takiar ..................... 361/684

* cited by examiner

*Primary Examiner*—Tuan Dinh
*Assistant Examiner*—Hung S. Bui

(57) ABSTRACT

The specification describes SDIO devices and SDIO cards wherein the SDIO devices are provided with enhanced functionality, and the SDIO cards are provided with enhanced IC capacity. A variety of multi-chip-module (MCM) approaches are used to increase the IC capacity of the SDIO card.

11 Claims, 4 Drawing Sheets

SDIO MEMORY AND INTERFACE CARD

FIELD OF THE INVENTION

This invention relates to interface cards for wireless units such as pocket PCs. More specifically it relates to SDIO interface cards with multiple functions.

BACKGROUND OF THE INVENTION (Portions of the technical material contained in this section may not be prior art.)

The evolution of computer size now allows very small, portable, units that can be carried as personal items, for example, in briefcases, or clothing pockets. There are a variety of such devices available commercially. Among those well known in the trade are PDAs and personal PCs. For convenience, these devices are generically referred to below as PDAs.

To extend the functional capacity of these devices, many have been equipped with slots to accommodate active integrated circuit cards. These slots are commonly designated as Secure Digital or SD slots, and the cards as SD cards. When a unit is provided with I/O capability the cards are referred to as SDIO cards.

One of the widely available functions for SDIO cards is wireless LAN interfacing. These provide the PDA with a wireless connection to a WLAN network. The SDIO card in this case carries an RF integrated circuit. The card typically has digital memory circuits to implement other SDIO functions.

The combination of these circuits on a single SDIO card presents a challenge for the SDIO card design. Additional functions will be added as PDA technology develops, placing further demands on the SDIO card.

Other devices also use SD technology. Many digital cameras are provided with SD slots and cards. The SD card functions as the image storage medium. In these devices the memory circuit in the card is very large, to allow many pictures to be stored. Cell phones are also provided with SDIO capability. These are often referred to as Smartphones.

Devices that use SDIO cards are typically miniaturized, i.e. they are deliberately made small to meet market demands. Consequently, the size of the SDIO cards is small. Typical SDIO cards are approximately 1×2 inches, with a thickness less than 0.1 inch. The thickness places a major size constraint on the integrated circuit capacity of the card.

SUMMARY OF THE INVENTION

We have designed a high density SDIO integrated circuit card that has very large functionality. It combines large digital memory capability with WLAN interface circuits. It uses Multi-Chip-Module (MCM) packaging technology to provide a compact IC structure. A preferred embodiment uses double-sided IC packaging, which contributes to the overall design efficiency. A key ingredient to realizing added capacity is the recognition that the slot thickness limits the thickness of the SDIO card, but only in the portion of the card that is contained within the device housing. The remaining portion of the card may have a larger thickness, and according to the main embodiments of the invention, is provided with additional IC circuits.

The enhanced capacity of the SDIO card design of the invention allows new product functionality. For example, a digital camera equipped with the SDIO card of the invention has sufficient memory for storing a large number of images, or for storing higher resolution images, and has the additional capability of uploading the stored images through the RF wireless LAN interface to a receiving station. The receiving station may be a local TV, a remote TV, or a remote (e.g. home) computer with mass memory. It may be a relative, business associate, or a commercial visual arts studio.

Increased IC capacity, and the effective marriage of large memory functions with RF wireless LAN functions, allows a variety of similar product enhancements.

DETAILED DESCRIPTION

Figure 1:
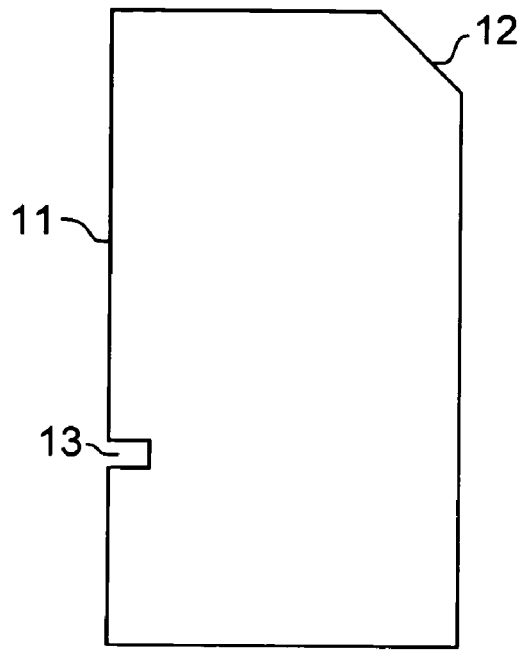
FIG. 1 shows the obverse side of a typical SDIO card.

FIG. 1 depicts one side of a conventional SDIO card 11. Standard features of SDIO cards include the beveled corner 12, and tab 13, which ensure that the card is inserted properly. The face of the card is typically planar.

Figure 2:
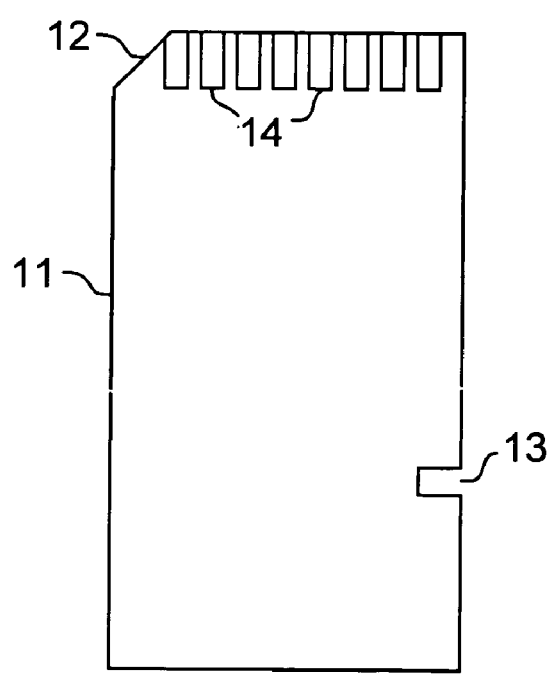
FIG. 2 shows the reverse side of the SDIO card of FIG. 1.

FIG. 2 shows the reverse side of the SDIO card, which is also essentially planar. This side has conductor pads 14, which, when the card is inserted into the device (in this example a PDA), engage conductor pads in the interior of the PDA. The conductor pads are interconnected to integrated circuit chip(s) in the SDIO card.

Figure 3:
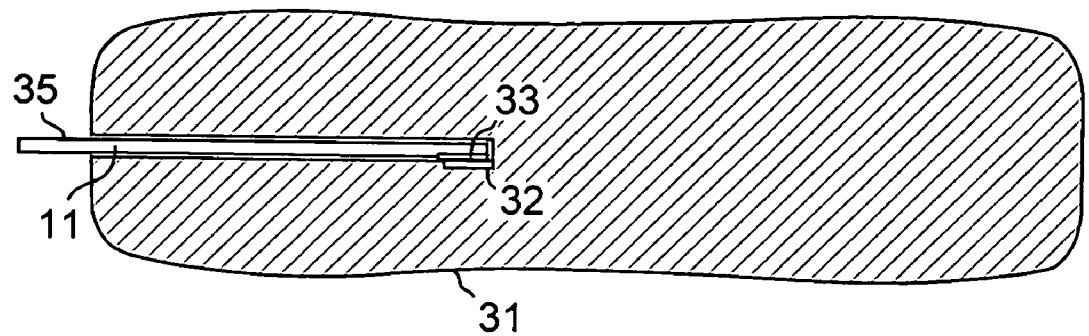
FIG. 3 is a schematic section view of a typical PDA showing a conventional SDIO card inserted.

A PDA device 31, with the SDIO card of FIGS. 1 and 2 inserted in a slot in the PDA, is shown in FIG. 3. The conductor pads 33 on the SDIO card 11 engage PDA contact pads 32 as shown. In common commercial embodiments, the conventional SDIO card is longer than the PDA slot, with a portion of the card 35 extending outside the PDA housing as shown in FIG. 3. The extension of the SDIO card facilitates handling for inserting and extracting the card. In some SDIO cards, especially those designed with a wireless LAN interface, the extended portion of the SDIO card may contain an encased RF circuit and an RF antenna.

Typical SDIO cards have a nominal thickness that is necessarily less than the thickness of the slot in the PDA. That thickness essentially defines the size of the integrated circuit devices contained in the SDIO card.

Figure 4:
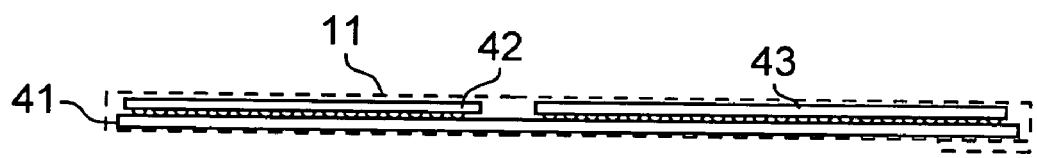
FIG. 4 is a schematic section view of the SDIO card of FIG. 3.

FIG. 4 shows a section view of a conventional SDIO card 11. The card contains a printed wiring board (PWB) 41, with one or more IC chips, here shown at 42 and 43, mounted on the PWB. The PWB may be any suitable support and interconnect structure, typically an epoxy resin board or flexible polymer substrate. Alternatively, it may be a ceramic or silicon interconnect substrate. Generically, these are referred to here as PWB. The PWB, with the IC chips mounted thereon, is encased in a suitable encasement, typically an epoxy or other tough polymer. Such encasements are well known in the art and widely used. The resulting SDIO card usually has dimensions roughly characterized as one by two (inches). The thickness is typically approximately 2 mm.

Most SDIO cards available commercially are made with dimensions that conform to industry standards. However, applicants have realized that the dimension standard relates to the portion of the card that fits within the PDA slot. The portion that may extend from the slot is not restricted by industry standard. According to the invention, the portion of the SDIO card that extends outside the PDA housing is enlarged to provide enhanced IC capacity.

Figure 5:
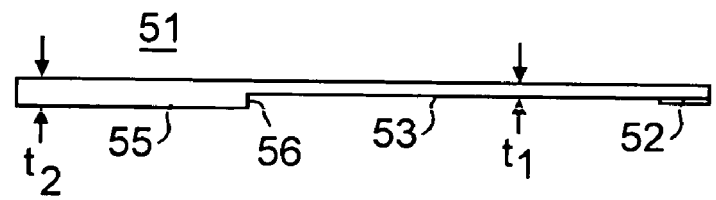
FIG. 5 is a schematic view of an enhanced capacity SDIO card according to the invention.

FIG. 5 shows a diagram that expresses the generic approach of the invention. The SDIO card, shown generally at 51, has a portion 53 with dimensions conforming to the industry standard, designated here as thickness $t_1$. A portion 55 of the SDIO card has an enlarged thickness $t_2$. The card has conventional conductor pads 52 on the bottom of the card as shown. The portion 55 that is adapted to remain outside the housing of the PDA device is referred to as the extended portion, and typically will have a step 56 on at least one side of the card. It will be recognized from this depiction that the SDIO card in this embodiment of the invention has an extended length, as compared with the SDIO card of FIGS. 3 and 4, as well as an enlarged thickness. It is practical to do either, or both, for enhanced IC capacity. For example, some applications may demand a conventional, or limited, card length, in which case only the thickness will be enlarged. As will become evident below, in the main thrust of the invention involves an increase in the thickness of the extended portion. It should also be evident that the figures in the drawing are not necessarily to scale. The extended portion 55 may be substantially smaller in a commercial device.

Figure 6:
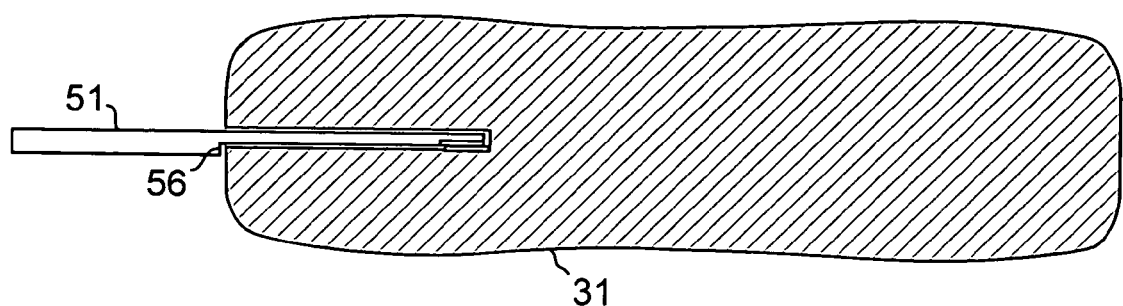
FIG. 6 is a schematic section view similar to that of FIG. 3 showing the enhanced capacity SDIO card inserted in a PDA.

The SDIO card 51 is shown inserted into a standard PDA device 31 in FIG. 6. Note that the step portion 56 actually aids in the insertion process, i.e. it restricts the length of the portion of the card that can be inserted into the device, thus reducing the risk of damage to the conductor pads and internal components of the PDA device if the card is inserted with excessive force.

Figure 7:
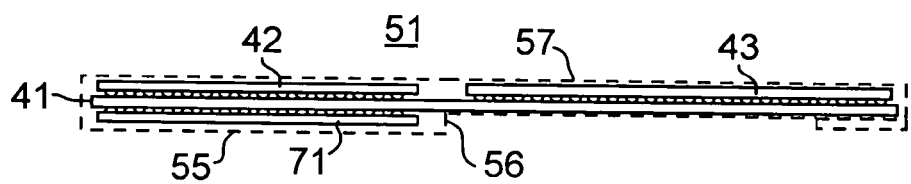
FIG. 7 is a more detailed section view of one embodiment of an SDIO card made according to the teachings of the invention.

The recognition that the external portion is relatively unconstrained in dimensions leads to SDIO card designs with enhanced IC capacity. One of these is shown in FIG. 7. This SDIO card is designed with an outline 57 that is similar to that of the SDIO card shown in FIGS. 5 and 6. The obverse side of the card is essentially planar, with the reverse side of the card having step 56. The overall structure of the card is similar to that of FIG. 4, with two IC chips 42, 43, mounted on PWB 41. The increased thickness of the extended portion 55 permits one or more additional IC chips 71 to occupy the added space. An important expedient used to implement this embodiment is mounting the additional IC chip 71 on the underside of PWB 41. This arrangement provides advantages in addition to enhanced IC capacity. It allows interconnections between the IC chips 42 and 71 to be made very short. The interconnection length is slightly more than the thickness of PWB 41. In practice, one of the IC chips, 42 or 71, is typically an RF chip that implements the wireless LAN interface. This chip will typically conform to standard 802.11b. The other chip, in a preferred embodiment, is a memory chip, and provides significant added memory capacity to the SDIO card. Yet a further advantage of the use of a double-sided MCM, where the extended portion comprises the combination of a memory IC chip on one side of the PWB and an RF IC chip on the other side, is that the RF and digital (memory) chips on the extended portion are isolated from one another. The RF IC chip can be further isolated if it located on the underside of the PWB, as at 71 in FIG. 7. In this embodiment the RF chip is the only IC chip located on one side of the PWB. However, there are applications wherein it is desirable to maintain the RF IC chip location in the other position, i.e. on top of the PWB, as in FIG. 4. In that case the added IC chip 71 may be a memory chip.

Figure 8:
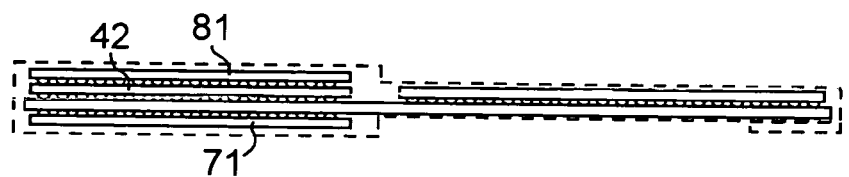
FIG. 8 is a section view of an alternative SDIO design according to the invention.

An alternative embodiment that provides enhanced IC capacity due to enlarged thickness of the extended portion of the SDIO card is shown in FIG. 8. Here the MCM design utilizes a chip-on-chip arrangement by mounting IC chip 81 on the top of IC chip 42. This arrangement also essentially doubles the IC chip capacity of the SDIO card. If, in addition, IC chip 71 is added on the bottom side of the PWB, as illustrated in FIG. 8, the IC capacity is essentially tripled.

It should be evident at this point that following the teachings of the invention a variety of MCM arrangements can be implemented, based on the availability of added space due to the enlarged thickness of the extended portion of the SDIO card. It is contemplated that at least one IC chip will be added, and the added IC chip will have at least a partially stacked relationship with respect to another IC chip. For the purpose of defining the invention, it is convenient to consider that the arrangement shown in FIG. 7 has a stacked chip configuration on the extended portion of the SDIO card, even though the PWB intervenes between the chips. The arrangement of IC chips 42 and 81 in FIG. 8 is obviously a stacked chip configuration.

Figure 9:
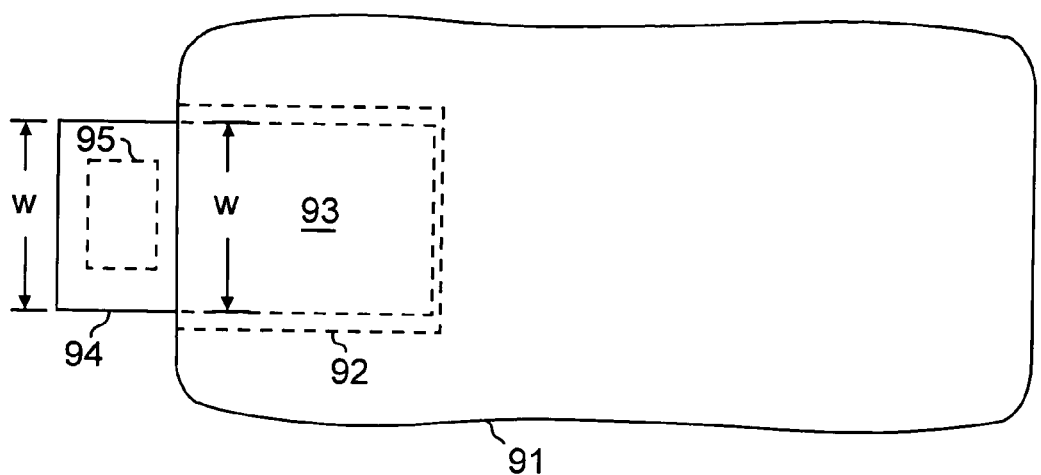
FIG. 9 is a top view of a conventional PDA device with a conventional SDIO card installed.

Expansion of the extended portion of the SDIO may also be effected in the width dimension, allowing even further enhancement of IC chip capacity. A conventional SDIO card and PDA slot arrangement, in a plan view, is shown in FIG. 9. PDA 91 is provided with a conventional slot 92. SDIO card 93 is shown with the standard dimensions for the portion within the PDA housing. The extended portion 94 carries an IC chip 95. In typical SDIO card designs the width W of the extended portion is the same as the width W of the portion of the card (93) that is inserted into the PDA slot 92.

Figure 10:
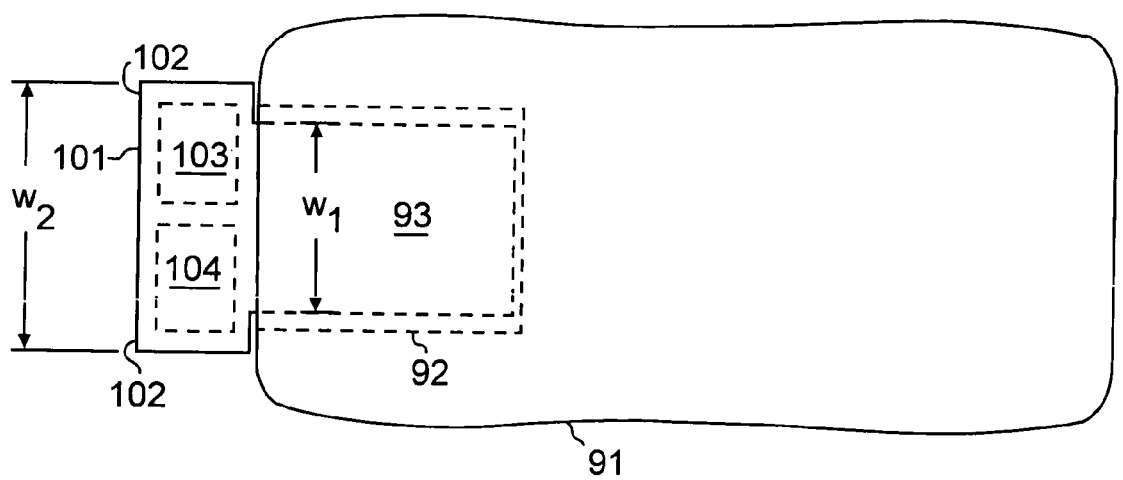
FIG. 10 is a top view of an SDIO card, designed according to the invention, wherein the card has an extended width as well as an extended thickness (not shown).

FIG. 10 shows the modification according to this embodiment of the invention. The width of the SDIO card at the extended portion 101, i.e. $W_2$, is deliberately made wider than the width $W_1$ of the portion of the card (93) within the PDA slot. The increase in width allows two IC chips 103 and 104 to be incorporated in the SDIO card. In a preferred form of this embodiment, one or both of the IC chips are in stacked arrangement with one or more other IC chips (not shown) as described earlier.

The integrated circuit chips used for the SDIO card are typically silicon IC chips. However, one or more of the IC chips may be GaAs chips, for example, a GaAs power amplifier chip.

The integrated circuit card described above is designed for SDIO applications, and for use with SDIO devices. However, it may be used in any application using plug-in integrated circuit cards. The device for which the SDIO card is adapted, described above as a PDA, is referred to generically as the host device.

To define the relative portions of the SDIO card that are adapted to be inserted within the host device, the card is typically rectangular with width W and length L. The length L is divided into a first portion $L_1$, the portion to be contained within the slot of the host device, and a second portion with length $L_2$, the extended portion that resides outside of the host device. According to the invention the thickness $T_1$ of the first portion of the card is substantially less than the thickness $T_2$ of the second, i.e. extended, portion. In most cases $T_2$ will be at least 1.2 times $T_1$, and where the thickness of the ICs in the extended portion is similar to the thickness of the ICs in the first portion, a stack of two chips will produce a thickness $T_2 > 1.4 T_1$.

Among the SDIO applications mentioned above, particularly prominent is the application of the SDIO card of the invention to digital cameras. State of the art digital cameras contain card slots similar to that shown in FIGS. 3 and 6. In many designs, the card is wholly contained within the camera housing. The cards are essentially memory cards and record images in a digital format in memory ICs on the card. When the user completes a series of pictures, the card is removed for further processing, storage etc. Using the SDIO card of the invention adds functionality to the digital camera. The enhanced IC capacity allows additional memory ICs and an RF wireless LAN interface IC to be added. The user may transmit the digital pictures over the wireless LAN to a remote receiving device. The enabling device feature for this function is an SDIO card with an RF wireless LAN interface chip, typically an IC chip incorporating the 802.11b standard.

The dual thickness feature of the SDIO card of the invention is a main functional aspect of the invention, i.e. the enhanced IC capacity is attributed to this property. The dual thickness is a property of the finished SDIO card, i.e. the card after it is encased, as well as of the first (inserted) portion and second (extended) portions of the PWB. The encasement is typically a polymer that is extruded, or otherwise suitably formed, around the PWB and the ICs mounted on the PWB. The term "encased thickness" refers to a finished card dimension. The term "PWB assembly" refers to the PWB and the IC chips mounted on the PWB.

While the extended portion of the card described above houses one or more IC chips with active devices, e.g. RF chips or memory chips, that portion of the card may also contain one or more passive components, and/or one or more integrated passive devices (IPDs). The active IC chips, and the passive devices, may be referred to by the generic term component(s).

Various additional modifications of this invention will occur to those skilled in the art. All deviations from the specific teachings of this specification that basically rely on the principles and their equivalents through which the art has been advanced are properly considered within the scope of the invention as described and claimed.

The invention claimed is:

1. An SDIO card comprising a first section and a second section wherein the first section is adapted to be inserted into an SDIO slot and has dimension conforming to an industry standard, the SDIO card comprising:
   a. a rectangular PWB having a first side with width W and length L, and a reverse side with a corresponding width W and length L, where L is greater than W, the PWB having a first section with width $W_1$, length $L_1$, and a second section with width $W_2$, and length $L_2$, where $L=L_1+L_2$,
   b. at least two integrated circuit (IC) components mounted on the PWB thus forming a PWB assembly, with one IC component mounted on the first side of the first section of the PWB, and one IC component mounted on the reverse side of the second section of the PWB,
   c. an encasement encasing the PWB assembly to form the SDIO card with the first section of the PWB in the first section of the encasement and the second section of the PWB in the second section of the encasement, and wherein the encasement encasing the first section of the PWB has thickness $T_1$ and the encasement encasing the second section of the PWB has thickness $T_2$, and wherein $T_2$ is substantially greater than $T_1$, and
   d. a plurality of conductor pads on the SDIO card.

2. The SDIO card of claim 1 additionally including at least one component on the first side of the second section of the PWB.

3. The SDIO card of claim 2 wherein the IC component on the reverse side of the second section of the PWB is a memory chip.

4. The SDIO card of claim 2 wherein the IC component on the reverse side of the second section of the PWB is an RF chip.

5. The SDIO card of claim 2 wherein the encasement encasing the first section of the PWB has width $W_1$ and the encasement encasing the second section of the PWB has width $W_2$, and wherein $W_2$ is substantially greater than $W_1$.

6. The SDIO card of claim 5 wherein the first section of the PWB has width $W_1$ and the second section of the PWB has width $W_2$, wherein $W_2$ is substantially greater than $W_1$ thus providing an extended width region for the second section, and further wherein at least part of an IC chip is mounted on the extended width region.

7. A SDIO device comprising a portable unit, a slot in the portable unit for receiving an SDIO card, a plurality of conductor pads in the slot, and an SDIO card inserted in the slot, the SDIO card comprising:
   a. a rectangular PWB having a first side with width W and length L, and a reverse side with a corresponding width W and length L, where L is greater than W, the PWB having a first section with width $W_1$, and length $L_1$, and a second section with width $W_2$, and length $L_2$, where $L=L_1+L_2$,
   b. at least two integrated circuit (IC) components mounted on the PWB thus forming a PWB assembly, with one IC component mounted on the first side of the first section of the PWB, and one IC component mounted on the reverse side of the second section of the PWB,
   c. an encasement encasing the PWB assembly to form the SDIO card with the first section of the PWB in the first section of the encasement and the second section of the PWB in the second section of the encasement, and wherein the encasement encasing the first section of the PWB has thickness $T_1$ and the encasement encasing the second section of the PWB has thickness $T_2$, and wherein $T_2$ is substantially greater than $T_1$, and
   d. a plurality of conductor pads on the SDIO card.

8. The SDIO device of claim 7 wherein the device is a PDA.

9. The SDIO device of claim 7 wherein the device is a cellphone.

10. The SDIO device of claim 7 wherein the device is a digital camera, a slot in the digital camera for receiving an SDIO card, and a wireless LAN interface control unit in the digital camera.

11. The SDIO device of claim 10 comprising a memory storage unit, and wherein the wireless LAN interface control is equipped to transmit the contents of the memory storage unit by wireless transmission to a remote receiver.

* * * * *